United States Patent
Chen et al.

(10) Patent No.: US 7,493,937 B2
(45) Date of Patent: Feb. 24, 2009

(54) HEAT SINK MOUNTING DEVICE

(75) Inventors: Chun-Chi Chen, Tu-Cheng (TW);
Yi-Qiang Wu, Shenzhen (CN);
Liang-Hui Zhao, Shenzhen (CN)

(73) Assignees: Fu Zhun Precision Industry (Shen Zhen) Co., Ltd., Shenzhen, Guandgong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 622 days.

(21) Appl. No.: 10/990,069

(22) Filed: Nov. 16, 2004

(65) Prior Publication Data

US 2005/0263264 A1    Dec. 1, 2005

(30) Foreign Application Priority Data

May 28, 2004    (CN) .................... 2004 2 0046532 U

(51) Int. Cl.
*F28F 7/00* (2006.01)
(52) U.S. Cl. .................. 165/80.2; 439/72; 439/331
(58) Field of Classification Search ............... 165/80.2, 165/80.3; 439/72, 331; 361/704
See application file for complete search history.

(56) References Cited

U.S. PATENT DOCUMENTS

| | | | | |
|---|---|---|---|---|
| 3,946,276 A * | 3/1976 | Braun et al. | ................. | 361/699 |
| 4,786,256 A * | 11/1988 | Angeleri et al. | ............... | 439/72 |
| 5,249,972 A * | 10/1993 | Walker | ......................... | 439/72 |
| 5,343,362 A * | 8/1994 | Solberg | ....................... | 361/710 |
| 5,730,210 A * | 3/1998 | Kou | ........................... | 165/80.3 |
| 5,807,104 A * | 9/1998 | Ikeya et al. | ................... | 439/73 |
| 6,213,806 B1 * | 4/2001 | Choy | .......................... | 439/331 |
| 6,243,267 B1 * | 6/2001 | Chuang | ..................... | 361/704 |
| 6,501,657 B1 * | 12/2002 | Carr | ........................... | 361/704 |
| 6,538,891 B1 | 3/2003 | He et al. | | |
| 6,549,410 B1 * | 4/2003 | Cohen | ........................ | 361/704 |
| 6,568,464 B1 | 5/2003 | He et al. | | |
| 6,618,253 B1 * | 9/2003 | Szu et al. | ..................... | 361/719 |
| 6,707,672 B2 | 3/2004 | Liu | | |
| 6,795,317 B1 * | 9/2004 | Liu | .............................. | 361/704 |
| 7,180,744 B2 * | 2/2007 | Chen et al. | .................. | 361/704 |
| 7,280,361 B1 * | 10/2007 | Lin | ............................. | 361/704 |

FOREIGN PATENT DOCUMENTS

TW    564010    11/2003
TW    570488    1/2004

* cited by examiner

*Primary Examiner*—Cheryl J Tyler
*Assistant Examiner*—Joseph Corrigan

(57) ABSTRACT

A mounting device for a heat sink includes a basis and a pair of operating bodies. Two pair of supporting members are provided on opposite sides of the basis. The operating body includes a pole connecting the supporting members, a pivot member pivotably attached to the pole, and at least a spring member encircling the pole. The pivot member includes a pressing portion adapted for pressing the heat sink. One end of the spring member is fixed on one of the supporting members, and the other end of the spring member is secured with the pivot member. The pivot member is pivotable from a first position to a second position under action of a force and returns back to the first position from the second position under action of the spring member after withdrawing the force.

2 Claims, 4 Drawing Sheets

HEAT SINK MOUNTING DEVICE

TECHNICAL FIELD

The present invention relates to mounting devices, and particularly to a mounting device for readily mounting a heat sink to a heat generating unit.

BACKGROUND

With the continuing development of computer electronics technology, new electronic units such as a central processing unit (CPU) can perform more and more functions. Heat generated by these modern electronic units has increased commensurately. Therefore, larger and heavier heat sinks are becoming increasingly necessary to efficiently remove the heat from the electronic units. Oftentimes, mounting devices are required for mounting the heat sinks to the electronic units.

A clip is often used to mount a heat sink to an electronic unit. The clip is usually integrally formed from a metal sheet. A typical such clip is formed by bending the sheet to form a pressing body and a pair of latching arms extending from opposite ends of the pressing body. Each latching arm is bent with a suitable angle relative to the pressing body, and defines a hole therein. However, securing of the clip requires a tool. Attachment and detachment of the clip are unduly laborious and time-consuming.

SUMMARY OF THE INVENTION

Accordingly, an object of the present invention is to provide a mounting device which can conveniently mount a heat sink to a heat generating unit.

To achieve the above-mentioned object, a mounting device in accordance with the present invention comprises at least a pair of supporting members and at least an operating body. The operating body comprises a pole connecting the supporting members, a pivot member pivotably attached to the pole, and at least a spring member encircling the pole. The pivot member comprises a pressing portion for pressing the heat sink. One end of the spring member is secured with one of the supporting members, and the other end of the spring member is secured with the pivot member. The pivot member is pivotable from a first position to a second position under action of a force and returns back to the first position from the second position under action of said spring member after withdrawing the force.

Other objects, advantages and novel features of the present invention will be drawn from the following detailed description of a preferred embodiment of the present invention together with the attached drawings, in which:

DETAILED DESCRIPTION OF A PREFERED EMBODIMENT

Figure 1:
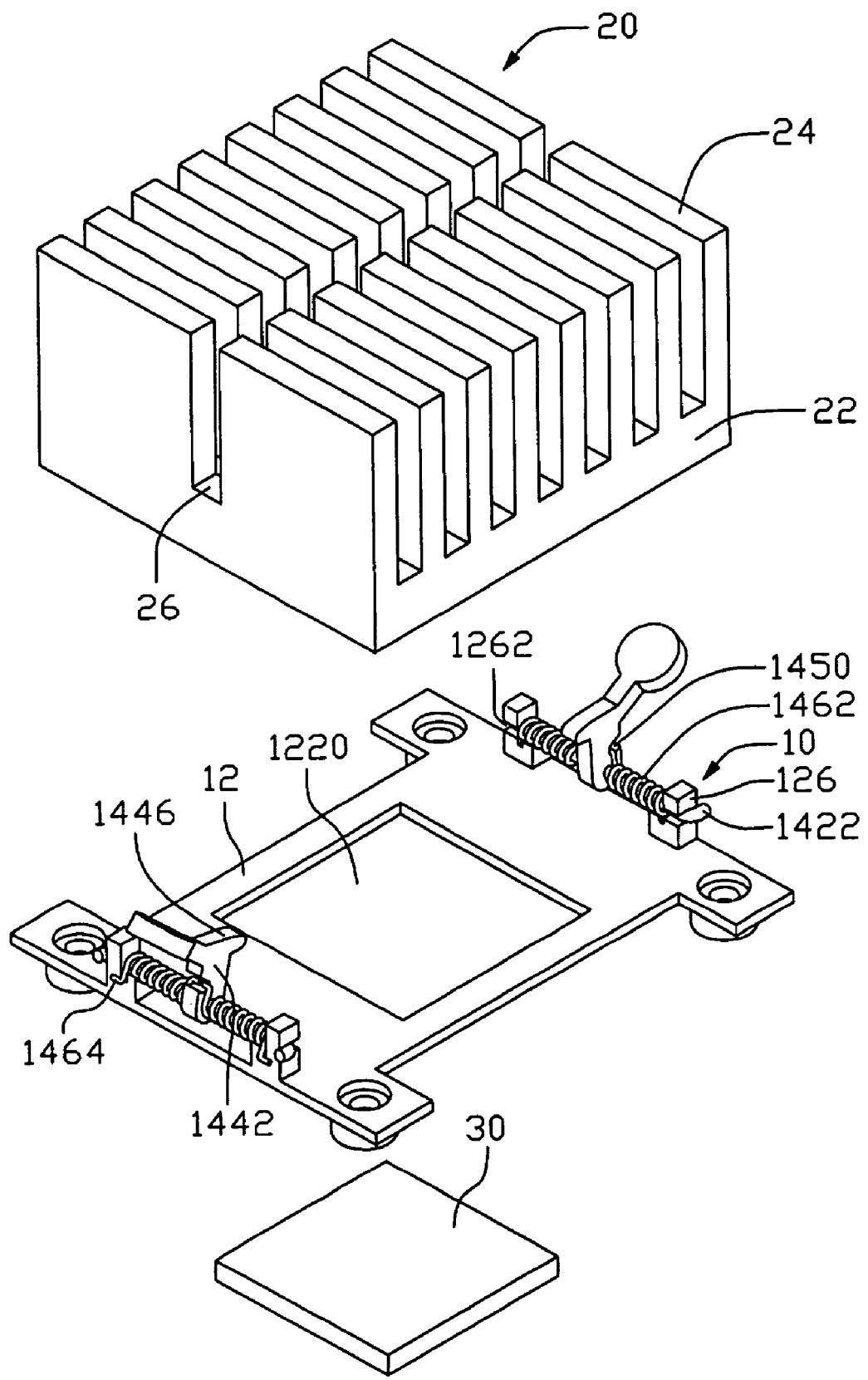
FIG. 1 is an exploded view of a mounting device in accordance with a preferred embodiment of the present invention, together with a heat sink and an electronic unit.

Referring to FIG. 1, a mounting device 10 in accordance with a preferred embodiment of the present invention for mounting a heat sink 20 to an electronic unit 30 is shown. The heat sink 20 comprises a base 22 and a plurality of parallel fins 24 extending from the base 22. The heat sink 20 defines a channel 26 crossing through the middle of the fins 24.

Figure 2:
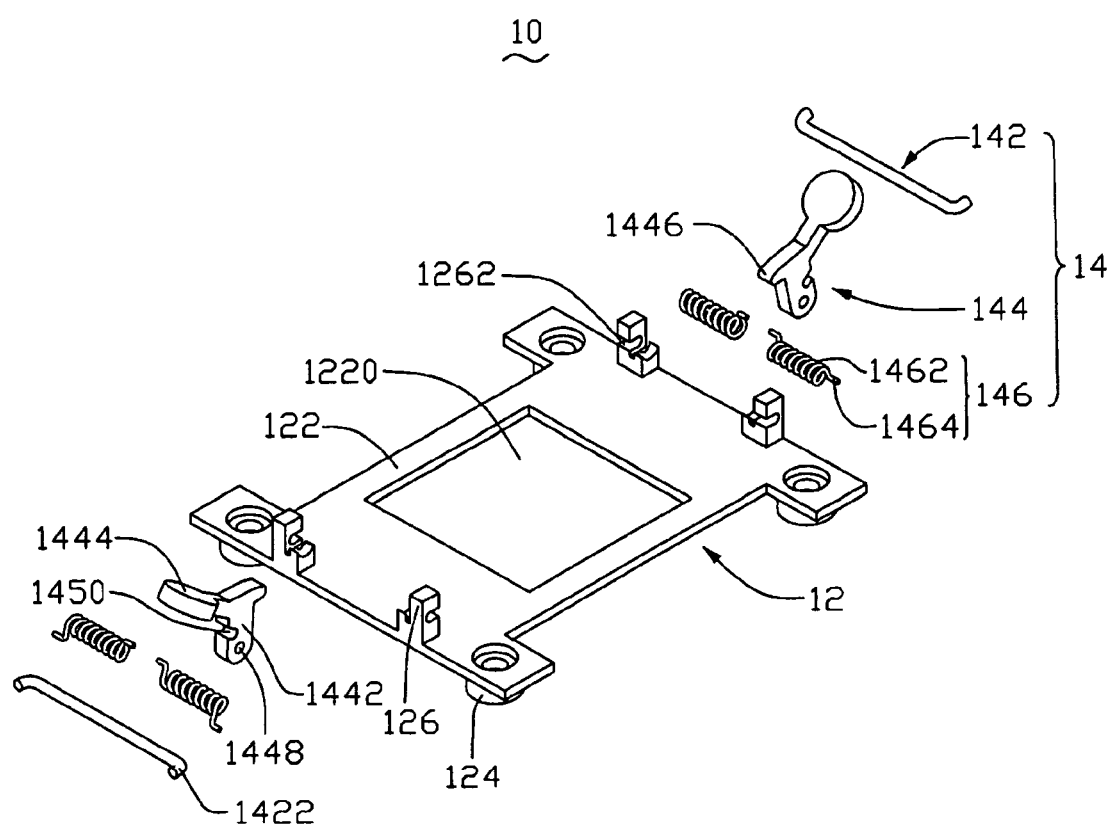
FIG. 2 is an exploded view of the mounting device of FIG. 1.

Referring also to FIG. 2, the mounting device 10 comprises a basis 12 for being attached to a printed circuit board (not shown), and two operating bodies 14 respectively installed on opposite sides of the basis 12.

The basis 12 comprises a quadrate plate 122. The plate 122 defines an opening 1220 for receiving the electronic unit 30. Each corner of the plate 122 extends downwardly to form a column 124. The basis 12 is for being mounted on the printed circuit board by screws (not shown) locked in the columns 124. Two pairs of apart supporting members 126 extend upwardly from opposite sides of the plate 122. Each supporting member 126 defines a groove 1262 in a surface facing the opening 1220 of the plate 122.

Each operating body 14 comprises a pole 142 for connecting the two supporting members 126 on one side of the plate 122 of the basis 12, a pivot member 144, and two cylindrical spring members 146. Two hooks 1422 are bent from opposite ends of the pole 142. The pivot member 144 comprises a connection portion 1442. A handle 1444 and a pressing portion 1446 extend from a top end of the connection portion 1442 in opposite directions. The connection portion 1442 defines a pivot hole 1448 and a groove 1450 being over the pivot hole 1448. The spring members 146 are torsion springs and each comprises a coil 1462, and two end catches 1464 extending from the coil 1462 in opposite directions.

In assembly of the mounting device 10, the pole 142 extends through the pivot hole 1448 of the pivot member 144 to cause the pivot member 144 to pivotably connect to the pole 142. Two coils 1462 of the spring members 146 respectively encircle the pole 142 and locate at opposite sides of the pivot member 144. The opposite ends of the pole 142 are received in the corresponding grooves 1262 of the supporting members 126 on one side of the basis 12 and two hooks 1422 clasp the supporting members 126. Two adjacent end catches 1464 of the spring members 146 are fixed in the groove 1450 of the pivot member 144 and the other two end catches 1464 of the spring members 146 clasp the corresponding supporting members 126. One operating body 14 is thus attached to one side of the basis 12. The other operating body 14 is attached to the opposite side of the basis 12 in the same way. In this state, the spring members 146 of the operating body 14 are located at loose state and the pressing portions 1446 of the pivot members 144 slant toward the opening 1220 of the basis 12 (see FIG. 1).

Figure 3:
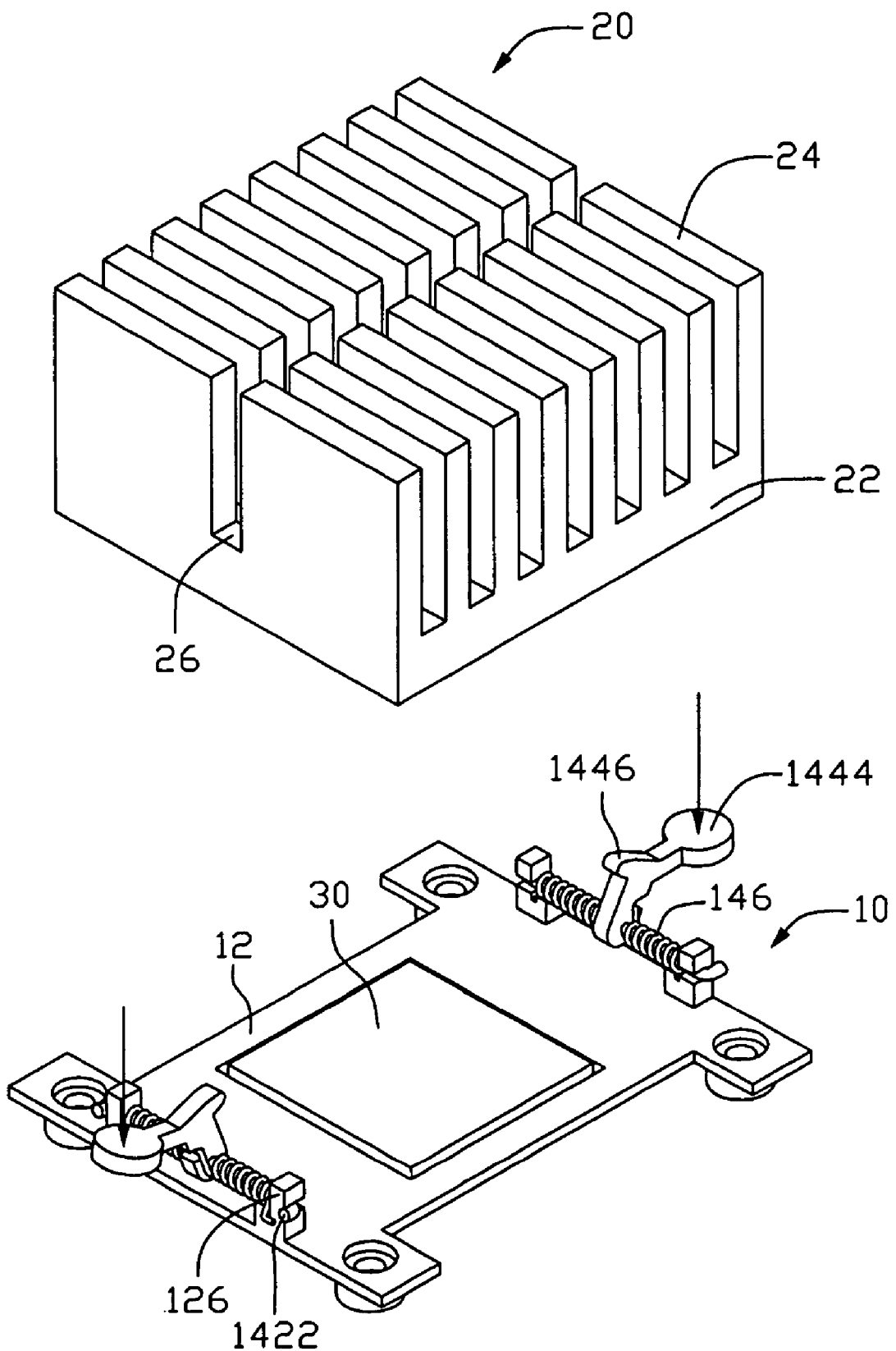
FIG. 3 is a partly assembled view of FIG. 1.
Figure 4:
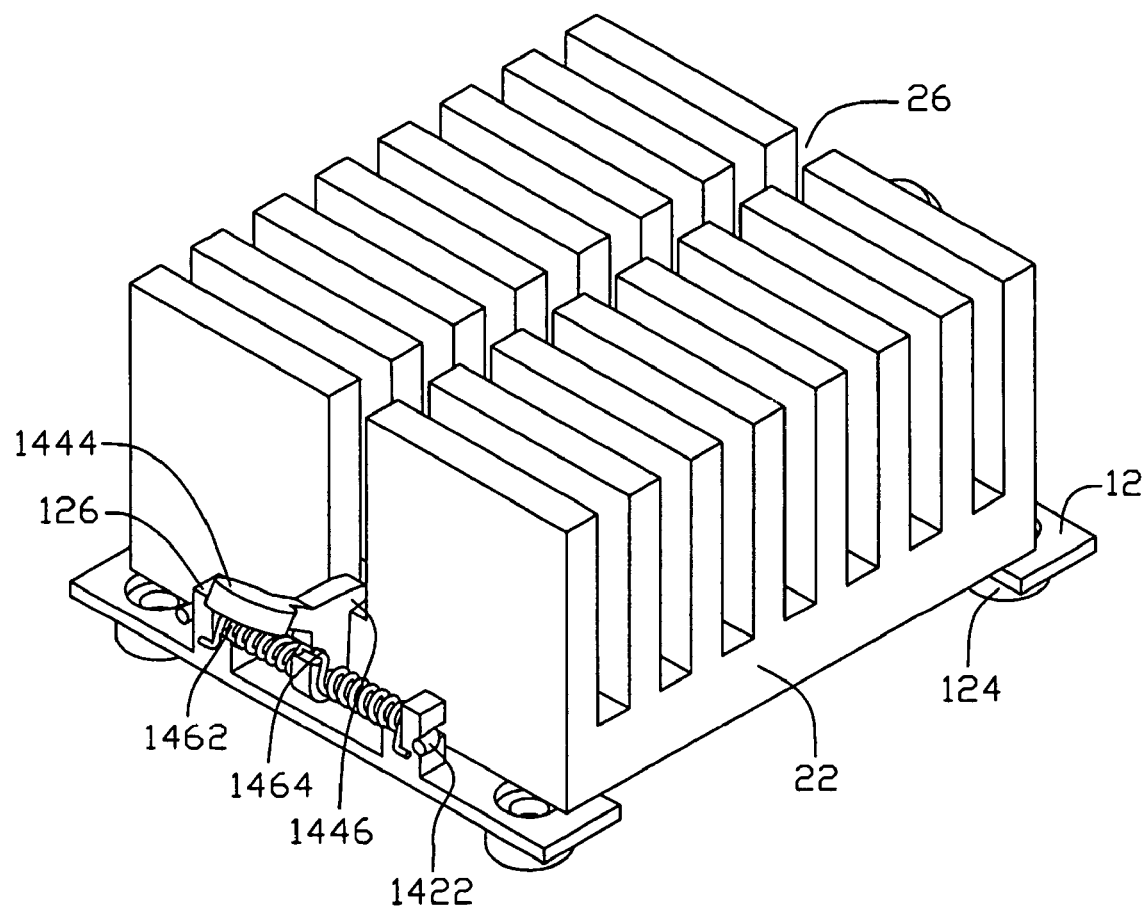
FIG. 4 is a fully assembled view of FIG. 1.

Referring to FIG. 3 and FIG. 4, when the heat sink 20 is attached to the electronic unit 30, the basis 12 is mounted on the printed circuit board and the electronic unit 30 extends through the opening 1220 of the basis 12. The handles 1444 of the pivot members 144 are pressed downwardly by a force (as the arrows shown in FIG. 3) and one end of each spring member 146 adjacent the pivot member 144 is therefore twisted outwardly. Accordingly, the pressing portions 1446 of the pivot members 144 move outwardly and away from the electronic unit 30. The heat sink 20 is then placed on the electronic unit 30, and the base 22 of the heat sink 20 is in loose contact with the top surface of the electronic unit 30. Thereafter, withdrawing the force exerted on the handles 1444 of the pivot members 144, the pressing portions 1446 are driven to move inwardly under the torsional force of the spring members 146 until they engage with opposite sides of the heat sink 20 in the channel 26. The pressing portions 1446 press the base 22 of the heat sink 20 toward the electronic unit 30. The heat sink 20 is thus firmly secured on the electronic unit 30 by the mounting device 10.

When detaching the heat sink 20 from the electronic unit 30, the handles 1444 of the pivot members 144 are pressed downwardly to cause the pressing portions 1446 to disengage from the channel 26 of the heat sink 20. After that, the heat sink 20 is easy detached from the electronic unit 30.

In the present invention, the urging force of the mounting device 10 is generated by the spring members 146. One end of each spring member 146 is fixed at one of the supporting members 126 and the other end of the spring member 146 is rotatable outwardly by exerting a force on the pivot member 144, which leads the spring member 146 producing a torsion. The torsion of the spring member 146 urges the spring member 146 rotating inwardly after withdawing the force exerted on the pivot member 144. The heat sink 20 is capable of being attached to the electronic unit 30 by pressing the handles 1444 of the pivot members 144, and detached from the electronic unit 30 merely by pressing the handles 1444 of the pivot members 144. No additional tool is required. The mounting device 10 provides easy and convenient operation.

In the preferred embodiment of the present invention, two operating bodies 14 are used. Alternatively, only one operating body 14 is used under a condition that the pressing portion 1446 of the pivot member 144 is long enough to press the base 22 of the heat sink 20.

It is understood that the invention may be embodied in other forms without departing from the spirit thereof. Thus, the present examples and embodiments are to be considered in all respects as illustrative and not restrictive, and the invention is not to be limited to the details given therein.

What is claimed is:

1. A mounting device for a heat sink to a heat generating electronic unit, comprising:
    a basis disposed around said heat generating electronic unit to allow said heat sink supportably placed thereon; and
    at least one operating body attached to said basis and reachable to said heat sink, said at least one operating body having:
    a resilient pivot member defining a pivot hole and a groove spaced from the pivot hole;
    a pole inserted through the pivot hole; and
    a spring having an end inserted into the groove, wherein the spring produces a torsion force directly acting on the pivot member to drive the pivot member to rotate about the pole, said at least one operating body is movable between a first position where a portion of said pivot member reaches to said heat sink and forces said heat sink moving toward said heat generating electronic unit, and a second position where said portion of said pivot member leaves away said heat sink, wherein the pole is supported by and parallel to said basis, and has two opposite ends bent to clasp the basis.

2. The mounting device as described in claim 1, wherein said portion of said pivot member is an extension from said pivot member and thereby insertable into a channel of said heat sink in said first position of said pivot member.

* * * * *